United States Patent [19]

Chang et al.

[11] Patent Number: 5,315,174
[45] Date of Patent: May 24, 1994

[54] PROGRAMMABLE OUTPUT SLEW RATE CONTROL

[75] Inventors: Herman M. Chang, Cupertino; Melvin Chan, Campbell, both of Calif.

[73] Assignee: Advanced Micro Devices, Inc., Sunnyvale, Calif.

[21] Appl. No.: 930,969

[22] Filed: Aug. 13, 1992

[51] Int. Cl.$^5$ .................. H03K 19/092; H03K 17/16
[52] U.S. Cl. ................................. 307/443; 307/475
[58] Field of Search ............... 307/443, 475, 451, 465, 307/468

[56] References Cited

U.S. PATENT DOCUMENTS

| | | | |
|---|---|---|---|
| 4,267,465 | 5/1981 | Haug et al. | 307/443 |
| 4,612,466 | 9/1986 | Stewart | 307/443 |
| 4,876,465 | 10/1989 | Podkowa et al. | 307/443 |
| 5,028,818 | 7/1991 | Go Ang et al. | 307/443 |
| 5,070,256 | 12/1991 | Grondalski | 307/443 |

Primary Examiner—Edward P. Westin
Assistant Examiner—Richard Roseen
Attorney, Agent, or Firm—Benman Collins & Sawyer

[57] ABSTRACT

An output buffer circuit is disclosed that minimizes ground bounce problems. The buffer circuit provides for an output pull-down pre-driver circuit that can be controlled by a programmable signal to minimize the ground bounce. By placing a strong and weak transistor on the gate of the output driver transistor and providing control circuitry for disabling the stronger transistor appropriately, an output signal is provided that can be driven quickly or slowly to its active level. By disabling the stronger transistor, ground bounce problems associated with high to low transitions of output drive transistor are significantly reduced.

11 Claims, 2 Drawing Sheets

PROGRAMMABLE OUTPUT SLEW RATE CONTROL

FIELD OF THE INVENTION

The present invention relates to the field or programmable integrated circuits and more specifically to improving the reliability and manufacturability of high speed programmable integrated circuits (PICs).

BACKGROUND OF THE INVENTION

With the ever increasing edge rate of the output drivers in programmable integrated circuits (PICs), ground bounce or ringing on the output of a device has become a significant problem in both the programming/ testing and the usage of PICs. The ground bounce problem is exacerbated by a noisy wafer sort environment, poorly designed programmer circuits and system board layouts that are carelessly designed.

It is known that many existing programmer circuits are very poorly grounded in use, and when verified, a PIC is more likely to fail. Hence, to provide a mode in which the output signal speed can be reduced which will also reduce the likelihood of "snap back" is highly desirable. Snap back occurs due to a large voltage difference present between the input pin and negatively going ground. In addition, during normal operation output overshoots/undershoots that are due to ringing should be minimized to prevent device failures. Finally, many customers want to be given the opportunity to select the output in which the signal speed is to be reduced. In many cases, it is not important that all of the output signals be high speed outputs.

A programmable integrated circuit normally requires that a "super voltage" be provided at one of its input pins to cause the device enter into an "Edit" mode where the EEPROM array can be erased, programmed, and verified. During the verify cycle, where all of the outputs of this device can switch from high to low simultaneously, the ground bounce can cause the device to fail to verify correctly and/or cause the high voltage pin to snap back due to the large voltage difference between the pin and the undershooting ground. This situation is especially severe in the wafer sort and third party programmer environment where ground integrity is fairly weak.

In the normal logic mode output overshoots/undershoots and ringing can cause the device that it is driving to double clock and fail. Another possible failure mechanism in logic mode is that the ground bounce is fed back into the input of the device thereby causing the device to oscillate.

The present invention provides circuitry that minimizes the above-mentioned problems in a high speed programmable integrated circuit.

SUMMARY OF THE INVENTION

An output buffer circuit is disclosed that minimizes the ground bounce problems associated with output slew rate by providing a programmable output control circuit. The output control circuit comprises pull-down pre-driver circuit that includes a strong transistor device on the input of an output driver transistor and a weaker transistor device in parallel with the strong transistor device. Both the strong transistor device and the weaker device are controlled by the data out signal. In addition, the stronger device is controlled by a signal which is activated by either logic signal such as an Edit mode signal or a signal from a programmable cell.

During a normal mode of operation, the weaker device will first drive the driver transistor slowly to its active region and then the strong transistor device will finish charging the output device at a faster rate to the full voltage potential. Ground bounce in normal mode is reduced. In the Edit mode or different programmable mode, the stronger device is disabled, hence only the weaker transistor device will drive the output circuit high. Accordingly, since the output signal speed is reduced, there will be a corresponding reduction in ground bounce.

In order to provide the enhancement as in the Edit mode, an additional programmable cell is built into each output logic block. The programmable cell is normally erased and does not interfere with the slew rate control circuitry. But, when the programmable cell is programmed, the output slew rate is adjusted as mentioned above for the Edit mode. Therefore, the user in accordance with the present invention can individually select the slew rate for each of his outputs depending on the speed and noise immunity requirements.

DETAILED DESCRIPTION

The present invention relates to an improvement in programmable integrated circuits. The following description is presented to enable one of ordinary skill in the art to make and use the invention and is provided in the context of a patent application and its requirements. Various modifications to the preferred embodiment will be readily apparent to those skilled in the art, and the generic principles defined herein may be applied to other embodiments. Thus, the present invention is not intended to be limited to the embodiments shown, but is to be accorded the widest scope consistent with the principles and feature described herein.

Figure 1:
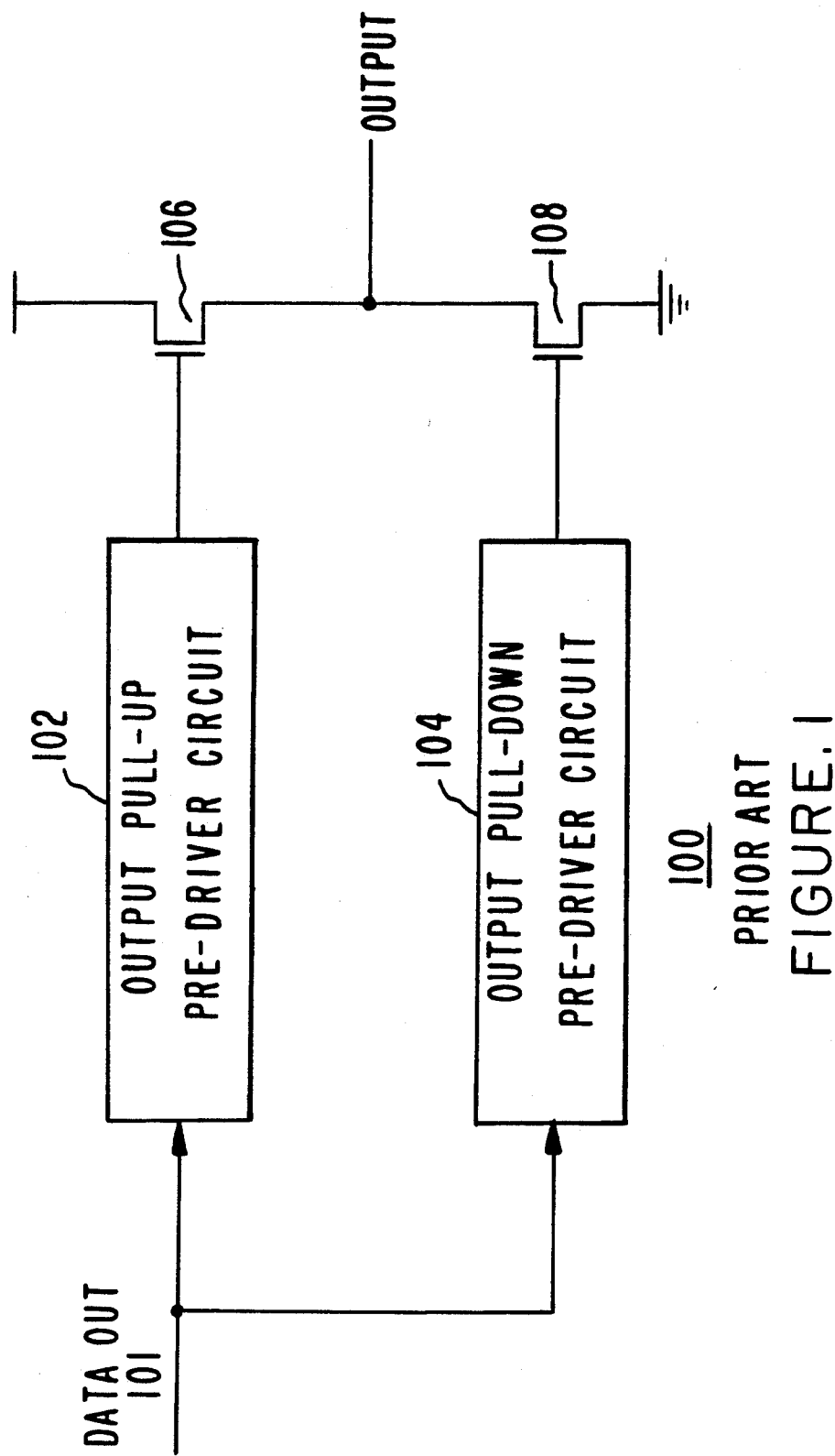
FIG. 1 is a block diagram of an output buffer control circuit.

Referring now to FIG. 1, what is shown is an output buffer circuit 100. The circuit 100 receives an input signal 101. The circuit 100 includes an output pull-up pre-driver circuit 102 and an output pull-down pre-driver circuit 104 which receives the input signal 101. The output pre-driver circuit 102 is coupled to the gate of transistor 106. The output of pre-driver circuit 104 is coupled to the gate of transistor 108. The source of transistor 108 is coupled to ground. The drain of transistor 108 is coupled to the output of the buffer circuit 100. The source of transistor 106 is coupled to the output of buffer circuit 100. The drain of transistor 106 is coupled to Vcc.

The pull-up pre-driver circuit 102 controls the gate of transistor 106, which causes the output of 100 to change from low to high or up to Vcc. The pull-down pre-driver circuit 104 controls the gate of transistor 108, which causes the output of 100 to change from high to low or from Vcc to ground. It is well known that since the transistor 108 is typically a large N-type transistor when driving it from high to low there is a problem with ringing on the output line and ground bounce. The present invention addresses this problem.

Figure 2:
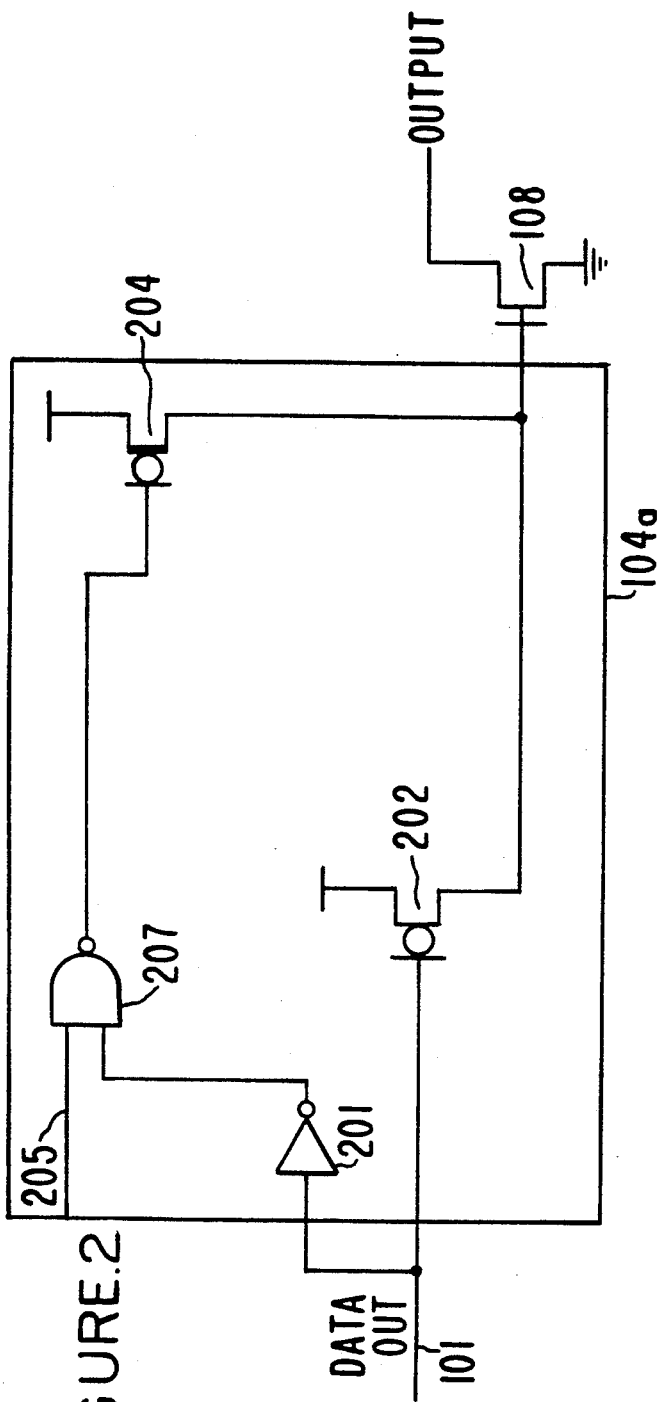
FIG. 2 is a block diagram of an output slew rate control circuit in accordance with the present invention.

Referring now to FIG. 2, shown in block diagram form are the essential elements for improved pull-down pre-driver circuit 104a in accordance with the present invention. It should be recognized by one of ordinary skill in art that there are other components necessary for the efficient operation of the circuit. It is also recognized that those other elements can be comprised of well known components. For the sake of simplicity and ease of understanding only, those elements relevant to the present invention are shown.

The pre-driver circuit 104a of the present invention comprises an inverter 201, a two input NAND gate 207, and transistors 202 and 204. Data output 101 is coupled to the gate of transistor 202 and the input of inverter 201. The output of inverter 201 is coupled to one input of NAND gate 207. The other input of NAND gate 207 receives either a logic signal such as the Edit mode signal or a programmable signal from an programmable cell or the like. The source of the transistor 202 is coupled to Vcc.

The drain of transistor 204 is coupled to the gate of transistor 108. The gate of transistor 204 is coupled to the output of NAND gate 207. The source of transistor 204 is coupled to Vcc. The drain of transistor 204 is coupled to the gate of driver transistor 108. In one practical circumstance, an additional transistor may be coupled to transistor 202 to pull the output of the pre-driver circuit 104a down to ground.

As is seen, transistors 202 and 204 are coupled such that their respective sources and drains are between Vcc and the gate of transistor 108. In the embodiment of FIG. 2, transistor 202 is a weaker device than transistor 204. In so doing, the transistor 108 can be charged slowly or quickly dependent upon whether transistor 202 and/or transistor 204 is active.

This circuit 104a operates in the following manner when signal 205 is in the high logic state, indicating that slew rate control is not active. In this mode, the NAND gate 207 acts like an inverter. Therefore, when the data out line 101 becomes a low logic state, turning on transistor 202, transistor 204 will turn on later.

On the other hand, when the line 205 is active (indicating that a reduction in the output slew rate is required) the NAND gate 207 is no longer responsive to the data out signal 101 and transistor 204 is disabled. Since only the weaker device 202 is active the slew rate of the output signal of driver 108 is significantly reduced.

Figure 3:
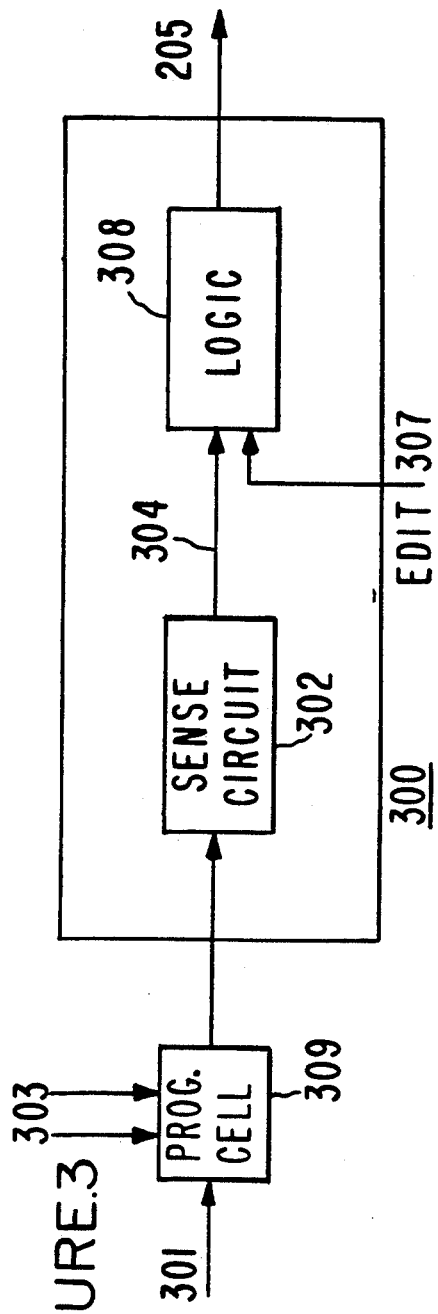
FIG. 3 is a block diagram of a programmable unit circuit which is utilized to control the output slew rate in accordance with the present invention.

FIG. 3 is a block diagram of a one programmable unit 300 that is utilized to disable the stronger transistor. Programmable unit 300 contains a programmable cell 309. It is known that a programmable integrated circuit (PIC) comprises an array of programmable cells which are used to implement logic functions in the PIC. For example, the particular unit may select the configuration of the output macrocell. One example of this function is to select the output to be active high or active low. Another example of this function is to select the register or the combinatorial output function.

For the sake of the simplicity we have shown in FIG. 3, a programmable unit 300 containing only one programmable cell, which is used to control the output slew rate of one output buffer. The unit 300 includes an input line 301 and the programming lines 303 that program the cell 309 so that the output at 300 will either provide an enabling signal or not. In one mode, the signal from cell 309 is sensed by sensing circuit 302. Sensing means 302 then provides the enabling output signal 304. In another mode, the logic circuit 308 can also be responsive to an Edit signal 307 to provide the enabling signal.

In either of these modes, the output signal 304 and the Edit signal 307 are provided to logic circuit 308 to produce input signal 205. Signal 205 controls the slew rate of the pull-down pre-driver circuit 104a. Hence the pre-driver circuit 104a can be either controlled by a logic signal or a programmable signal to drive the transistor 108 more slowly through the weaker device.

Hence in this embodiment, the controlling of the output slew rate during Edit mode and with an programmable cell can be implemented with variety of output slew rate control circuitries. These circuits can be of traditional CMOS design utilizing typically a plurality of p-type and n-type transistors. In addition, it should be well recognized the sensing circuit 302 and the converter 308 can be implemented using typical circuit design techniques.

Although the present invention has been described in accordance with the embodiments shown in the figures, one of ordinary skill in the art will recognize that there could be variations to those embodiments and those variations would be within the spirit and scope of the present invention. Accordingly, many modifications may be made by one of ordinary skill in the art without parting from the spirit of the present invention, the scope of which is defined solely by the appended claims.

We claim:

1. An output buffer circuit for receiving an input signal and providing an output signal, the output buffer circuit for reducing ground bounce of the output signal, the output buffer circuit including an output drive transistor, the driver transistor including a gate; the output buffer circuit comprising:

a first active device coupled to the gate of the output driver transistor for charging the driver transistor at a first rate responsive to the input signal being at a first logical level;

a second active device coupled to the gate of the output driver transistor for charging the driver transistor at a second rate responsive to the input signal being at a first logical level; the first active device being stronger than the second active device;

and means for disabling the first active device responsive to a logic signal being provided thereto, whereby the ground bounce is minimized.

2. The output buffer circuit of claim 1 in which the logic signal is provided by a programmable unit.

3. The output buffer circuit of claim 1 in which the logic signal can be controlled by a programmable cell.

4. The output buffer circuit of claim 1 in which the logic signal provides an indication that the circuit is in an Edit mode.

5. The output buffer circuit of claim 1 in which the first active device comprises a first P-type transistor.

6. The output buffer circuit of claim 2 in which the second active device comprises a second P-type transistor.

7. The output buffer circuit of claim 3 in which the disabling means comprises:

means for receiving a programmable signal;
   means for sensing the programmable signal coupled to the receiving means; and means for providing a disable signal responsive to the sensing means.

8. An output pull-down pre-driver circuit for receiving an input signal and providing an output signal, the pre-driver circuit for reducing ground bounce at the output signal, the pre-driver circuit being coupled to an output driver transistor, the driver transistor including a gate, the pre-driver circuit comprising:
- a first P-type transistor coupled to the gate of the output driver transistor for charging the driver transistor at a first rate responsive to the input signal being at a first logical level;
- a second P-type transistor coupled to the gate of the output driver transistor for charging the driver transistor at a second rate responsive to the input signal being at a first logical level;
- the first P-type transistor being stronger than the second P-type transistor; and
- means for disabling the first P-type transistor responsive to a logic signal being provided thereto, the disabling means further comprising;
- means for receiving the logic signal;
- means for sensing the logic signal coupled to the receiving means; and
- means for providing a disable signal to the first P-type transistor responsive to the sensing of the logic signal.

9. The pre-driver circuit of claim 8 in which the sensing means includes means to sense a plurality of logic signals to disable the first P-type transistor.

10. The pre-driver circuit of claim 8 in which one of the signals that will disable the first P-type transistor is an Edit signal.

11. The pre-driver circuit of claim 9 in which a logic signal is provided by a programmable cell.

* * * * *